United States Patent
Ivanov et al.

(10) Patent No.: US 9,768,745 B2
(45) Date of Patent: Sep. 19, 2017

(54) ARRANGEMENT AND METHOD FOR RADIO-FREQUENCY (RF) HIGH POWER GENERATION

(71) Applicant: OOO Siemens, Moscow (RU)

(72) Inventors: Evgeny Ivanov, Moscow (RU); Andrey Krasnov, Moscow (RU); Konstantin Nikolskiy, Ivanteevka (RU); Stepan Polikhov, Ramenskoye (RU); Georgy Sharkov, Moscow (RU); Alexander Smirnov, Moscow (RU)

(73) Assignee: OOO SIEMENS, Moscow (RU)

( * ) Notice: Subject to any disclaimer, the term of this patent is extended or adjusted under 35 U.S.C. 154(b) by 0 days.

(21) Appl. No.: 15/107,719

(22) PCT Filed: Dec. 24, 2013

(86) PCT No.: PCT/RU2013/001164
§ 371 (c)(1),
(2) Date: Jun. 23, 2016

(87) PCT Pub. No.: WO2015/099560
PCT Pub. Date: Jul. 2, 2015

(65) Prior Publication Data
US 2016/0322945 A1     Nov. 3, 2016

(51) Int. Cl.
*H03F 3/68* (2006.01)
*H03F 3/60* (2006.01)
(Continued)

(52) U.S. Cl.
CPC ............ *H03F 3/602* (2013.01); *H03F 3/19* (2013.01); *H03F 3/21* (2013.01); *H03F 3/72* (2013.01);
(Continued)

(58) Field of Classification Search
CPC .................................... H03F 3/68; H03F 3/60
(Continued)

(56) References Cited

U.S. PATENT DOCUMENTS 4,780,685 A    10/1988   Ferguson
5,872,481 A *   2/1999   Sevic ............... H03F 1/0277
                                                              330/124 R
(Continued)

FOREIGN PATENT DOCUMENTS

WO     WO 98/29941     7/1998
WO     WO 01/28029     4/2001

OTHER PUBLICATIONS

Office Action dated Feb. 20, 2017 corresponding to Korean Patent Application No. (PCT) 10-2016-7020211.

*Primary Examiner* — Patricia T Nguyen
(74) *Attorney, Agent, or Firm* — Cozen O'Connor

(57) ABSTRACT

A method and arrangement for RF high power generation includes a power combiner having RF inputs and an RF output, and at least two power amplifier modules, respectively electrically connected by a transmission line to an input of the power combiner, wherein a directional coupler is electrically connected to the RF output of the power combiner and every transmission line includes an RF switch, where the Method includes measuring and determining values of the power amplifier modules, storing the values and applying the values as a correction to the input signal of the power amplifier modules.

18 Claims, 2 Drawing Sheets

(51) Int. Cl.
*H03F 3/72* (2006.01)
*H03F 3/19* (2006.01)
*H03F 3/21* (2006.01)

(52) U.S. Cl.
CPC .. *H03F 2200/102* (2013.01); *H03F 2200/421* (2013.01); *H03F 2200/451* (2013.01); *H03F 2203/211* (2013.01); *H03F 2203/7236* (2013.01)

(58) Field of Classification Search
USPC ........................................ 330/295, 53, 124 R
See application file for complete search history.

(56) References Cited

U.S. PATENT DOCUMENTS

| | | | |
|---|---|---|---|
| 8,829,993 B2* | 9/2014 | Briffa | H03F 1/025 330/136 |
| 2004/0228422 A1 | 11/2004 | Silveira et al. | |
| 2005/0270095 A1 | 12/2005 | Burke et al. | |
| 2009/0201084 A1* | 8/2009 | See | H03F 1/0244 330/51 |
| 2009/0273397 A1* | 11/2009 | Bockelman | H03F 1/0277 330/51 |
| 2009/0286495 A1* | 11/2009 | Martikkala | H03F 3/602 455/115.1 |
| 2013/0070836 A1* | 3/2013 | Singerl | H03F 1/0277 375/238 |

* cited by examiner

ARRANGEMENT AND METHOD FOR RADIO-FREQUENCY (RF) HIGH POWER GENERATION

CROSS-REFERENCE TO RELATED APPLICATIONS

This is a U.S. national stage of application No. PCT/RU2013/001164 filed 24 Dec. 2013.

BACKGROUND OF THE INVENTION

1. Field of the Invention

The present invention relates to a method and arrangement for Radio-Frequency (RF) high power generation comprising at least one power combiner having RF inputs and at least one RF output, and at least two power amplifier modules, which are respectively electrically connected by at least one transmission line to an input of the at least one power combiner.

2. Description of the Related Art

Radio-Frequency Radio-Frequency (RF) and/or microwave power is produced with appropriate generators. RF power generators for high power applications are based on tubes, such as klystrons, inductive output tubes or magnetrons. Alternatively, solid state technology is used for RF power generators, particularly transistor technology. With solid state RF power generators, a reliable RF power production with small dimensions and high efficiency is possible. One disadvantage of transistor technology is a low RF power output per transistor chip, in the range of up to 1.5 kW power output at 500 MHz frequency. For comparison, with klystrons as an example for tube technology, up to some Megawatt RF power output is possible.

To generate high amounts of power with, for example, transistor based RF generators, an aggregation of RF generators is necessary. An aggregation of transistors in a single power amplifier (PA) based, for example, on push- pull or a balanced kind of topology, can increase the complexity of the system and increases the risk of failure. If single transistors fail, the entire device must be exchanged. An alternative way to generate high levels of power is to use a number of power amplifier modules with a common, particularly single power combiner.

In a modular arrangement, RF power from power amplifier modules, connected via transmission lines to the common power combiner, is aggregated in the power combiner to a high RF power. For example, coaxial cables and/or strip-lines are used as transmission lines. Due to different length and properties, each of the transmission lines introduces an individual power loss and signal phase shift to the arrangement. This leads to the appearance of back reflected power from the power combiner input, which can be unequally divided between power amplifiers, i.e., RF modules. It causes additional power losses, reduces the overall output RF power and can lead to overheating of amplifiers.

To reduce or prevent losses, each RF module must be configured separately to generate an individual signal with a certain amplitude and a certain phase, in order to provide equal signals to the power combiner. US20130170512A1 and US20130051416A1, for example, disclose the adjustment of RF modules that is performed manually. Here, all RF modules are fed in-phase by a single pre-amplified oscillator, and amplitude as well as phase of each RF module connected to the power combiner is manually adjusted, using selectively variable impedance circuits connected to a respective input of each RF module. The disclosed conventional method can only be applied, if the length of the transmission line is permanent. Changes in length thus necessitates a new adjustment. After the system is once assembled, it can hardly be adjusted. Deviations of electronic components, such as by aging, cannot be compensated for and increase losses.

Alternatively, amplitudes and phases of RF module signals can be continuously monitored and adjusted during amplifier operation. Additional devices, such as numerous directional couplers, are necessary and have to be installed in each RF module output branch, thereby increasing costs and complexity.

SUMMARY OF THE INVENTION

In view of the foregoing, it is an object of the present invention to provide an arrangement and a method for RF high power generation that overcome the above mentioned problems. In particular, it is an object of the present invention to provide a cost effective, easy to handle assembly, which can be adjusted automatically, even after assembly. A reduction of RF output power loss, arising from events, such as aging of components and/or changes in connection lines length, are prevented and a maximum output power from the power combiner should be reachable. The disclosed arrangement and method provide the ability to adjust the output signals of components, particularly after assembly of components, is flexible, at any time, easy and without much effort, such that power losses at the output of a power combiner are reduced.

These and other objects and advantages are achieved by providing a method and arrangement for RF high power generation that comprises at least one power combiner having RF inputs and at least one RF output, and at least two power amplifier modules, respectively electrically connected by at least one transmission line to an input of the at least one power combiner, At least one RF switch is comprised of the at least one transmission line and at least one directional coupler is electrically connected to the at least one RF output of the at least one power combiner.

The disclosed arrangement for RF high power generation provides a cost effective, easy to handle assembly, which can be adjusted automatically to optimize the power output, even after assembly. A reduction of RF output power loss, arising from events, such as aging of components and/or changes in connection lines length, can be prevented and a maximum output power from the power combiner can be reached using the at least one RF switch and the at least one directional coupler for adjustment of electrical parameters. The output signals of the at least two power amplifier modules can be changed and optimized/synchronized, particularly after assembly of the arrangement, is flexible at any time, easily and without much effort. As a result, power losses at the output of the power combiner are reduced.

In the embodiment, the RF switches are externally controlled RF switches, particularly a pin-diode or mechanical switch, where the switch exhibits an Ohmic resistance in the switched off state in the range of 50 OHM. External control can be provided by a control unit, for example, comprising a computer.

At least one load can be electrically connected to the at least one RF output of the at least one power combiner via the at least one directional coupler, particularly comprised of at least one output transmission line. In alternative embodiments, the load is a defined resistor for measurement reasons, and/or the load is a device such as an electrical acceptor of the RF high power provided by the arrangement.

A device for storing measured values from the at least one directional coupler can particularly comprise a control unit with EPROM. Alternatively or additionally, a computer can comprise the control unit to process the values stored.

An amplitude $A^{DC}$ and phase $\Psi^{DC}$ detector can particularly comprise a control unit electrically connected to the at least one directional coupler, particularly connected to the forward signal output of the at least one directional coupler. The detector or other device for measuring amplitude $A^{DC}$ and/or phase $\Psi^{DC}$ provides, after measurement particularly one after another, the values stored in the device for storing, which are used to determine values for the correction of every single amplifier module.

The method for RF high power generation in accordance with the present invention, particularly with an arrangement in accordance with the above-described embodiments, comprises measuring and determining with at least one device correction values for power amplifier modules electrically connected to at least one power combiner via at least one RF switch respectively, storing the correction values, and applying the correction values as a correction to the input signal to the power amplifier modules.

The determined and/or applied correction values can comprise amplitude difference $\Delta Ai$ and phase difference $\Delta \Psi i$ respectively for every power amplifier module, particularly compared to a reference module r.

The step of measuring correction values comprises, for N power amplifier modules respectively, switching on a module number k, which generates a RF signal with amplitude Ak and phase $\Psi k$ with a corresponding RF switch number k switched in pass through state, where all other modules are in a turned off state and/or corresponding RF switches are in load state, in which no signal from the corresponding module passes through, and measuring amplitude Ak and phase $\Psi k$ with an amplitude and phase detector.

The values amplitude Ak and phase $\Psi k$ can be measured for all modules and respectively stored, the values of one module r are selected as reference values, and for all other modules an amplitude difference $\Delta Ai$ and phase difference $\Delta \Psi i$ are determined as difference values to the respective values of the reference module r.

In accordance with the invention, the first measured module is selected as the reference module at the beginning of the measurement, and/or values of all other modules are compared to the values of the first measured module, where the amplitude difference $\Delta Ai$ and phase difference $\Delta \Psi i$ are particularly determined and stored after every measurement of a module k. In alternative embodiments, the storage of the amplitude Ak and phase $\Psi k$, except for the reference module r, is avoided or skipped.

Alternatively, for all modules one after another amplitude Ak and phase $\Psi k$ are measured respectively and stored, where the reference module r is selected after the measurement, particularly the module with values nearest to the average value of all modules, and amplitude difference $\Delta Ai$ and phase difference $\Delta \Psi i$ are determined for every module k relative to the values of the reference module r and stored.

The method can be an automatic method, particularly controlled by a computer, and/or a manual method, particularly during production or maintenance. The ability to use the arrangement in accordance with the disclosed embodiments of the present invention and the method in an automated manner, also allows adjustments during the use of the arrangement, for example, necessary due to changes by aging effects of components. It is possible to adjust the arrangement easily and rapidly after exchanges, for example, of connection lines during maintenance. The high output RF power of the arrangement can be received continuously or preserved with time, and power losses can be avoided or at least reduced. The method can be repeated after a period of time, particularly at regularly time intervals. The advantages in connection with the described method for RF high power generation in accordance with the present invention are similar to the previously, in connection with the arrangement for RF high power generation, described advantages and vice versa.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The present invention is further described hereinafter with reference to an illustrated embodiment shown in the accompanying drawing, in which.

DETAILED DESCRIPTION OF THE EXEMPLARY EMBODIMENTS

Figure 1:
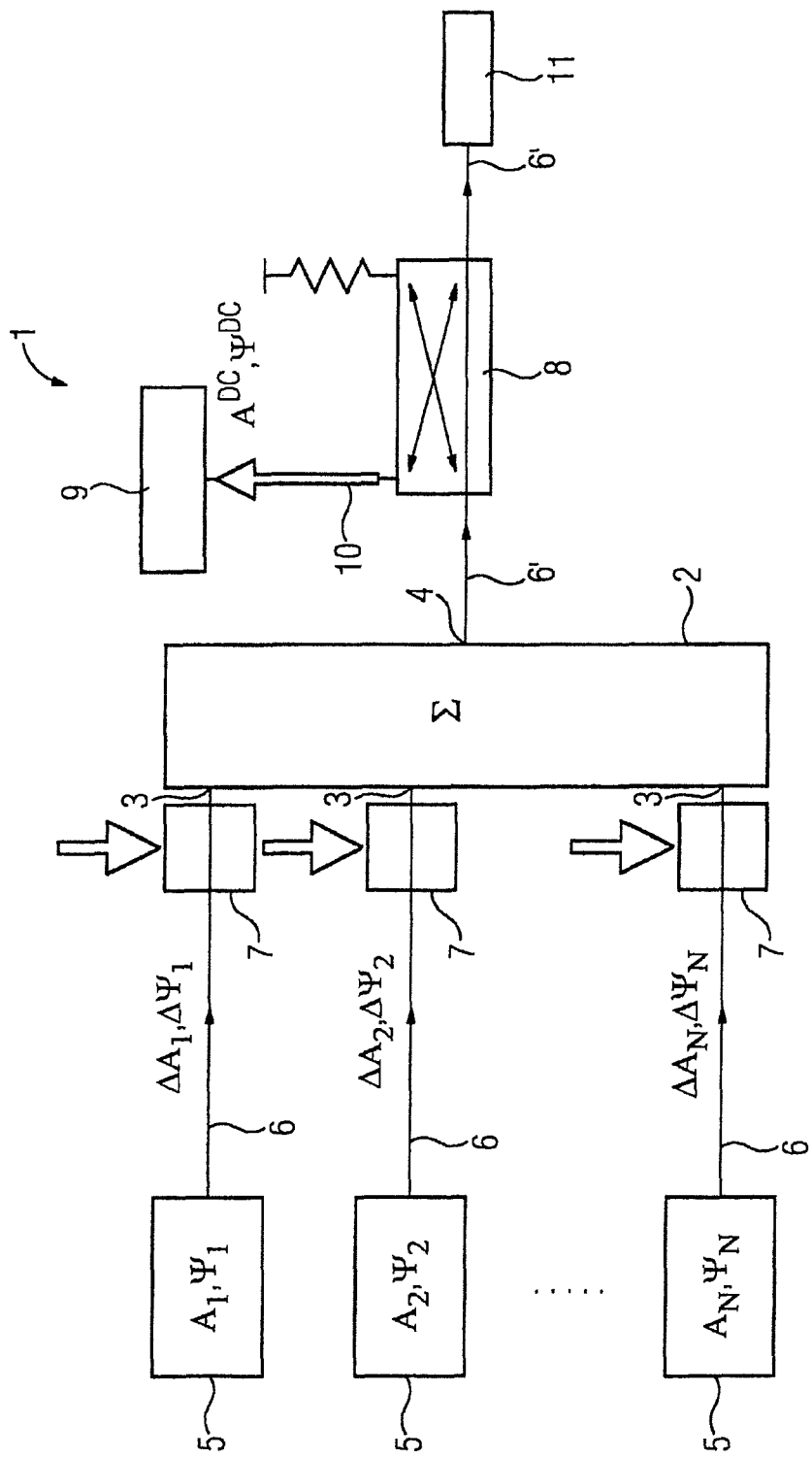
FIG. 1 illustrates an arrangement for RF high power generation in accordance with the present invention.

FIG. 1 shows an arrangement 1 for RF high power generation in accordance with the present invention, comprising a power combiner 2 having RF inputs 3 and an RF output 4. Power amplifier modules 5 with their output are electrically connected respectively by a transmission line 6 to the respective input 3 of the power combiner 2. An RF switch 7 comprises every transmission line 6, arranged in-between the output of the respective RF module and the respective input 3 to the power combiner 2. A directional coupler 8 is electrically connected to the RF output 4 of the power combiner 2, in-between the output 4 and a load 11, within an output transmission line 6'. An amplitude $A^{DC}$ and phase $\Psi^{DC}$ detector is electrically connected to the directional coupler 8, in the forward signal direction 10.

With a number N of RF module power amplifiers 5, as depicted in FIG. 1 by doted points between the second and the number N module 5, a number of N inputs 3 of the power combiner 2 are respectively electrically connected by an input transmission line 6 to the respective power amplifier module 5. Every input transmission line 6 comprises a RF switch 7, i.e., the switch 7 is electrically interconnected in-between the output of a respective module 5 and the respective input 3 of the power combiner 2. Each switch 7 can be switch on or off independently from others, externally controlled, for example, by a control unit particularly comprising a computer. The switch, for example, can be a mechanical switch or a pin-diode. In a switched off mode, the switch can exhibit, for example, 50 Ohm resistance, switching off the direct electrical connection between respective module 5 and power combiner 2. Above and in the following the wording switching on is used to mean an RF signal is passed through, and the wording switching off is used to mean the pass through of RF signals is blocked.

Each RF module 5, such as module k, has an individual low-level RF signal input with its specific amplitude $A_k$ and phase $\Psi_k$. The amplitude $A_k$ and phase $\Psi_k$ can be regulated/changed by the control unit, which is not shown in FIG. 1 for purposes of simplicity.

The output 4 of power combiner 2 is electrically connected by an output transmission line 6' to, for example, an external load 11. The external load 11 can be a medical device or other electrical acceptor, using the high RF power provided by the arrangement 1. In-between the load 11 and the output 4 of power combiner 2, a directional coupler 8 is electrically connected and comprises the output transmission line 6'. The forward signal 10 of the directional coupler 8 is transferred using an electrical connection between directional coupler 8 and an amplitude $A^{DC}$ and/or phase $\Psi^{DC}$ detector 9. The detector measures amplitude $A^{DC}$ and/or phase $\Psi^{DC}$ of the RF signal together or separately, where the RF signal is provided as the output of the power combiner 2. The value of the amplitude $A^{DC}$ and the phase $\Psi^{DC}$ is stored in a device, such as an EPROM comprising the control unit, and are used to correct the values of amplitude $A_k$ and phase $\Psi_k$ of every module 5 to obtain the maximum RF output power from the power combiner 2 respectively from the arrangement 1.

The power combiner 2 functions such that a minimum reflection from the inputs 3 and a maximum power at the output 4 is achieved, if all input signals have the same amplitude and phase. The transmission lines 6 coming from different power amplifier modules 5, because they can be arbitrarily chosen, can introduce different amplitude attenuation $\Delta A_i$ and phase shifts $\Delta \Psi_i$ to the respective input signal of the power combiner 2.

With a number j being the number of a reference RF module 5, which is smaller or equal to the total number N of all modules 5 and larger or equal to 1 ($1 \leq j \leq N$), and with all other modules 5 with respective number i not equal to j ($i \neq j$), where i is smaller or equal to the total number N of all modules 5 and larger or equal to 1 ($1 \leq i \leq N$), all modules with number i are subject to amplitude and phase configuration. That means, for all other modules 5 apart from the reference module 5, the amplitude $A_k$ and phase $\Psi_k$ has to be adjusted/changed.

According to the requirement of equality of all signals, i.e., the signals from all modules 5 should be equal in amplitude $A_k$ and phase $\Psi_k$ at the respective input of the power combiner 2 to obtain a maximum power output at the power combiner 2 and/or to obtain a normal system performance, the amplitudes $A_i$ and phases $\Psi_i$ of all RF amplifier modules 5 (module i, $1 \leq i \leq N$, $i \neq j$) have to be adjusted by the amplitude attenuation $\Delta A_i$ and phase shift $\Delta \Psi_i$ with respect to the reference RF module 5 (module j).

For measurements of amplitude $A_k$ and phase $\Psi_k$ of individual modules 5 with detector 9 at the forward signal output 10 of directional coupler 8, which is electrically connected to the output 4 of the power combiner 2, RF switches 7 are used. By measuring the amplitude $A_k$ and phase $\Psi_k$ of individual modules 5 at the output of the power combiner 2, only one detector 9 is needed. This reduces costs and the complexity of the arrangement 1 compared to an arrangement 1 with detectors 9 at every single input 3 of the power combiner 2, to measure amplitude $A_k$ and phase $\Psi_k$ of every individual module 5.

An RF signal passes through an RF switch in a first state of the switch 7, where the switch acts as an arbitrary load in another, second state. The switch 7 can act in the two states, for example, once as open and once as 50 Ohm load. RF switches 7 can be realized, for example, with pin diodes or mechanically.

To maximize the output RF power of the power combiner 2, i.e., to align all modules 5 in amplitude $A_k$ and phase $\Psi_k$, a reference module 5 with number j can be switched on, i.e., it generates a signal. The respective RF switch 7 of this module j is in the pass-though state, i.e., open. All other modules 5 (module i, $1 \leq i \leq N$, $i \neq j$) are turned off and all respective RF switches 7 are in an arbitrary load state, i.e., closed.

The amplitude $A^{DC}$ and phase $\Psi^{DC}$ detector 9, also called APD, comprised of the control unit (not shown in FIG. 1 in its entirety for reasons of simplicity), measures the amplitude $A_k$ and phase $\Psi_k$ of the "forward" signal 10 from the directional coupler 5. In this special case, it measures amplitude $A_j$ and phase $\Psi_j$ of the reference module 5 with number j.

The measured value of amplitude $A_j$ and phase $\Psi_j$ of the reference module 5 with number j are stored, for example, in an EPROM and/or computer comprising the control unit.

The same procedure is repeated for all other modules 5. A module 5 with number i can be switched on, i.e., it generates a signal. The respective RF switch 7 of this module i is in pass-though state, i.e., open. All other modules 5 are turned off and all respective RF switches 7 are in an arbitrary load state, i.e. closed. The amplitude $A^{DC}$ and phase $\Psi^{DC}$ detector 9 measures the amplitude $A_i$ and phase $\Psi_i$ of the "forward" signal 10 from the directional coupler 5, i.e., of the module 5 with number i. The measured values of amplitude $A_i$ and phase $\Psi_i$ of the module 5 with number i are stored.

After the measurement of amplitude $A_k$ and phase $\Psi_k$ for all N single modules 5 are performed and all values are stored, values of amplitude attenuation $\Delta A_i$ and phase shift $\Delta \Psi_i$ are calculated for every single module i except the reference module j. The values are calculated as a difference of the value of module j and the value of module i for all RF amplifier modules i ($1 \leq j = N$, $i \neq j$). The amplitude attenuation $\Delta A_j$ and phase shift $\Delta \Psi_j$ for reference module j are set/accounted to be zero.

The value of amplitude attenuation $\Delta A_i$ and phase shift $\Delta \Psi_i$ are applied as a correction signal to the low-level input signal into the relevant RF module i, respectively. For the reference module j, no correction is necessary. The modules 5 are, during use of the arrangement 1, all switched on and all RF switches are in an open state. As a result of the applied correction to the input of modules 5, the amplitude $A_k$ and phase $\Psi_k$ of signals from all N modules 5 at the input 3 of the power combiner 2 is equal. The output power of the power combiner 2 is maximized by deleting, respectively minimizing differences in signals at the inputs 3 of the power combiner 2. A maximal output power can be used by the electrical acceptor/load 11.

The above described features of embodiments in accordance with the present invention can be combined with each other and/or can be combined with embodiments known from the state of the art. For example, the described steps of the method to minimize power losses in the power combiner 2 can be applied in the described order or in a different order in time. The calibration of signals at the power combiner 2 inputs 3 can be performed with all modules 5 to an arbitrary, pre-defined value of amplitude $A_k$ and phase by measuring all values for all modules 5, without using the value of a reference module j. For calculation of amplitude attenuation $\Delta A_k$ and phase shift $\Delta \Psi_k$ the predefined value of amplitude Ak and phase Ψk is used, and calculation is performed for every modules 5 with the respective measured values.

Different kinds of switches 7 can be used, for example, simple electronic or automated mechanical on/off switches. Connection lines 6, 6' can be, for example, realized in the way of printed circuit board tracks, metal wires and/or coaxial cables. Different lengths and dimensions, such as thickness, can be used for the connection lines. More than one power combiner 2 and/or more than one output 4 can be used, with or without respectively connected detectors 9. The output power can, for example, be measured as a fraction of the complete output power of a power combiner 2.

An advantage of the described arrangement and method in accordance with disclosed embodiments of the present invention is that the process of amplitude and phase balancing at the power combiner inputs 3 can be fast and easy. Independent transmission line designs, using transmission lines with different properties is possible, particularly with transmission lines that differ in length, conductivity and/or cross-section. The method can be performed automatically or in parts manually. The entire method can also be performed manually, for example, during maintenance, without any automated steps. It can be performed during production of the arrangement, after changes of components such as connection lines during maintenance, or after, for example, regular time periods to adjust to component aging.

Figure 2:
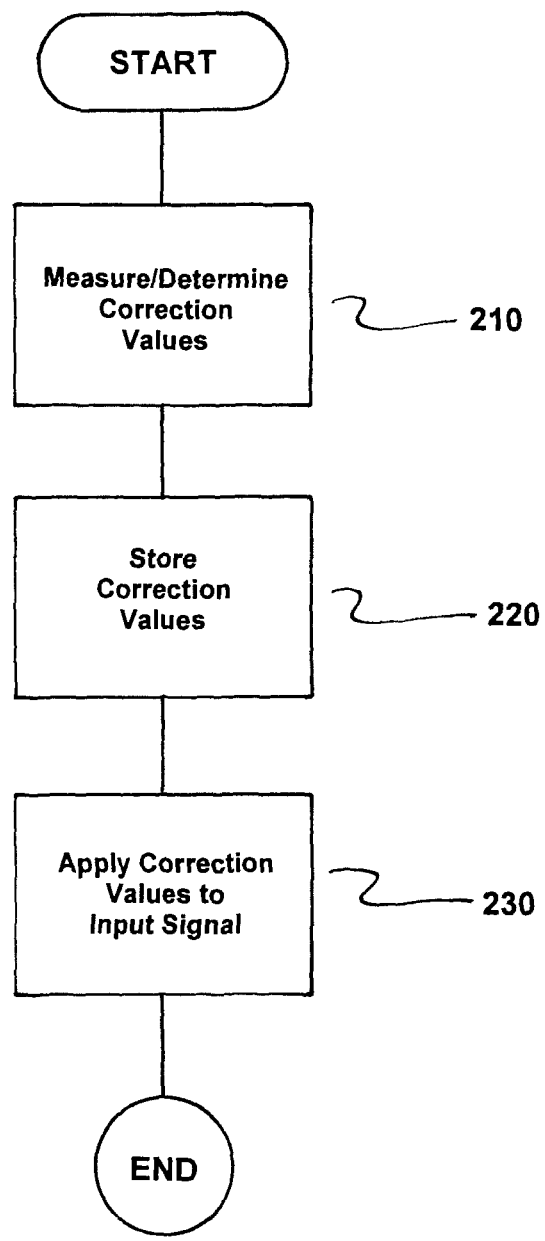
FIG. 2 is a flowchart of the method in accordance with the invention.

FIG. 2 is a flowchart of a method for radio frequency (RF) high power generation. The method comprises measuring and determining with at least one device (8, 9) correction values for power amplifier modules (5) electrically connected to at least one power combiner (2) via at least one RF switch (7), respectively, as indicated in step 210. The measured and determined correction values are stored, as indicated in step 220. The correction values are now applied as a correction to an input signal to the power amplifier modules (5), as indicated in step 230.

While there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An arrangement for Radio-Frequency (RF) high power generation, comprising:
   at least one power combiner (2) having a plurality of RF inputs (3) and at least one RF output (4);
   at least two power amplifier modules (5) respectively electrically connected by at least one transmission line (6) to an input (3) of the at least one power combiner (2);
   at least one directional coupler (9) electrically connected to the at least one RF output (4) of the at least one power combiner (2); and
   an amplitude and phase detector which receives a forward signal from the at least one directional coupler;
   wherein the at least one transmission line comprises at least one RF switch.

2. The arrangement according to claim 1, wherein the at least one RF switch is an externally controlled RF switch.

3. The arrangement according to claim 2, wherein the externally controlled RF switch comprises a pin-diode or mechanical switch having an Ohmic resistance in a switched-off state in a range of 50 Ohms.

4. The arrangement according to claim 1, further comprising:
   at least one load electrically connected to the at least one RF output of the at least one power combiner via at least one output transmission line comprising the at least one directional coupler.

5. The arrangement according to claim 2, further comprising:
   at least one load electrically connected to the at least one RF output of the at least one power combiner via at least one output transmission line comprising the at least one directional coupler.

6. The arrangement according to claim 1, wherein the amplitude and phase detector comprises a storage device which stores measured values from the at least one directional coupler.

7. The arrangement according to claim 6, wherein the storage device further comprises a controller having an EPROM.

8. The arrangement according to claim 1, further comprising:
   a controller electrically connected to the at least one directional coupler and including the amplitude and phase detector.

9. The arrangement according to claim 8, wherein the controller is electrically connected to a forward signal output of the at least one directional coupler.

10. A method for Radio-Frequency (RF) high power generation, comprising:
    measuring and determining with at least one device correction values for power amplifier modules electrically connected to at least one power combiner via at least one RF switch, respectively, said power combiner having at least one directional coupler electrically connected to the at least one RF output of the at least one power combiner;
    storing the measured and determined correction values; and
    applying the correction values as a correction to an input signal to the power amplifier modules;
    wherein an amplitude and phase detector receives a forward signal from the at least one directional coupler.

11. The method according to claim 10, wherein at least one of (i) the determined correction values and (ii) applied correction values comprise amplitude decay and phase shift respectively for every power amplifier module compared to a reference module.

12. The method according to claim 10, wherein said measuring correction values comprises for N power amplifier modules respectively:
    switching on a module number k upon generating a RF signal with amplitude and phase with a corresponding RF switch number k switched in pass through state, all other modules being in at least one of (i) a turned off state and (ii) corresponding RF switches are in a load state, in which no signal from the corresponding module passes through; and measuring amplitude and phase with an amplitude and phase detector.

13. The method according to claim 11, wherein said measuring correction values comprises for N power amplifier modules respectively:

switching on a module number k upon generating a RF signal with amplitude and phase with a corresponding RF switch number k switched in pass through state, all other modules being in at least one of (i) a turned off state and (ii) corresponding RF switches are in a load state, in which no signal from the corresponding module passes through; and measuring amplitude and phase with an amplitude and phase detector.

14. The method according to claim 12, wherein the amplitude and phase values are measured for all modules and respectively stored, values of one module r are chosen as reference values, and for all other modules an amplitude attenuation and phase shift are determined as difference values to values of the reference module.

15. The method according to claim 14, wherein at least one of (i) the first measured module is selected as a reference module and (ii) values of all other modules are compared to values of the first measured module, the amplitude difference and phase differences being determined and stored after every measurement of a module, without storing amplitude and phase except for the reference module.

16. The method according to claim 14, wherein for all modules one after another, amplitude and phase are measured respectively and stored, a reference module comprising a module with values nearest to an average value of all modules is selected, and amplitude attenuation and phase shift are determined for every module relative to values of the reference module and stored.

17. The method according to claim 1, wherein the method is at least one of (i) implemented automatically via a computer and (ii) implemented manually during production or maintenance.

18. The method according to claim 10, wherein the method is repeated after a period of time comprising regular intervals.

* * * * *